(12) United States Patent
Willer et al.

(10) Patent No.: US 6,777,725 B2
(45) Date of Patent: Aug. 17, 2004

(54) NROM MEMORY CIRCUIT WITH RECESSED BITLINE

(75) Inventors: Josef Willer, Riemerling (DE); Herbert Palm, Hohenkirchen (DE)

(73) Assignee: Ingentix GmbH & Co. KG, Munich (DE)

( * ) Notice: Subject to any disclaimer, the term of this patent is extended or adjusted under 35 U.S.C. 154(b) by 0 days.

(21) Appl. No.: 10/171,643

(22) Filed: Jun. 14, 2002

(65) Prior Publication Data

US 2003/0230783 A1 Dec. 18, 2003

(51) Int. Cl.⁷ .............................................. H01L 29/768
(52) U.S. Cl. ...................... 257/244; 257/202; 257/215; 257/216; 257/288; 438/257
(58) Field of Search ................... 257/215, 216, 257/244, 288, 202; 438/257

(56) References Cited

U.S. PATENT DOCUMENTS

| | | | | |
|---|---|---|---|---|
| 4,845,539 A | * | 7/1989 | Inoue | 257/302 |
| 5,488,579 A | * | 1/1996 | Sharma et al. | 365/185.08 |
| 5,792,690 A | * | 8/1998 | Sung | 438/253 |
| 6,468,865 B1 | * | 10/2002 | Yang et al. | 438/262 |
| 6,548,861 B2 | * | 4/2003 | Palm et al. | 257/330 |
| 2002/0024092 A1 | | 2/2002 | Palm et al. | 257/330 |

OTHER PUBLICATIONS

Boaz Eitan et al.: "Can NROM, a 2–bit Trapping Storage NVM Cell, Give a Real Challenge to Floating Gate Cells?", *International Conference on Solid State Devices and Materials*, Tokyo, 1999.

* cited by examiner

*Primary Examiner*—Nathan J. Flynn
*Assistant Examiner*—Scott R Wilson
(74) *Attorney, Agent, or Firm*—Laurence A. Greenberg; Werner H. Stemer; Ralph E. Locher

(57) ABSTRACT

An integrated memory circuit of the type of an NROM memory includes recessed bit lines formed of a material having a low ohmic resistance. By recessing the bit lines with respect to the semiconductor substrate surface of a peripheral controlling circuit for an array of memory cells allows to form the word line lithography on a perfect or almost perfect plane so that the word line formation results in a production with higher yield and, therefore, lower costs for the individual integrated memory circuit.

40 Claims, 8 Drawing Sheets

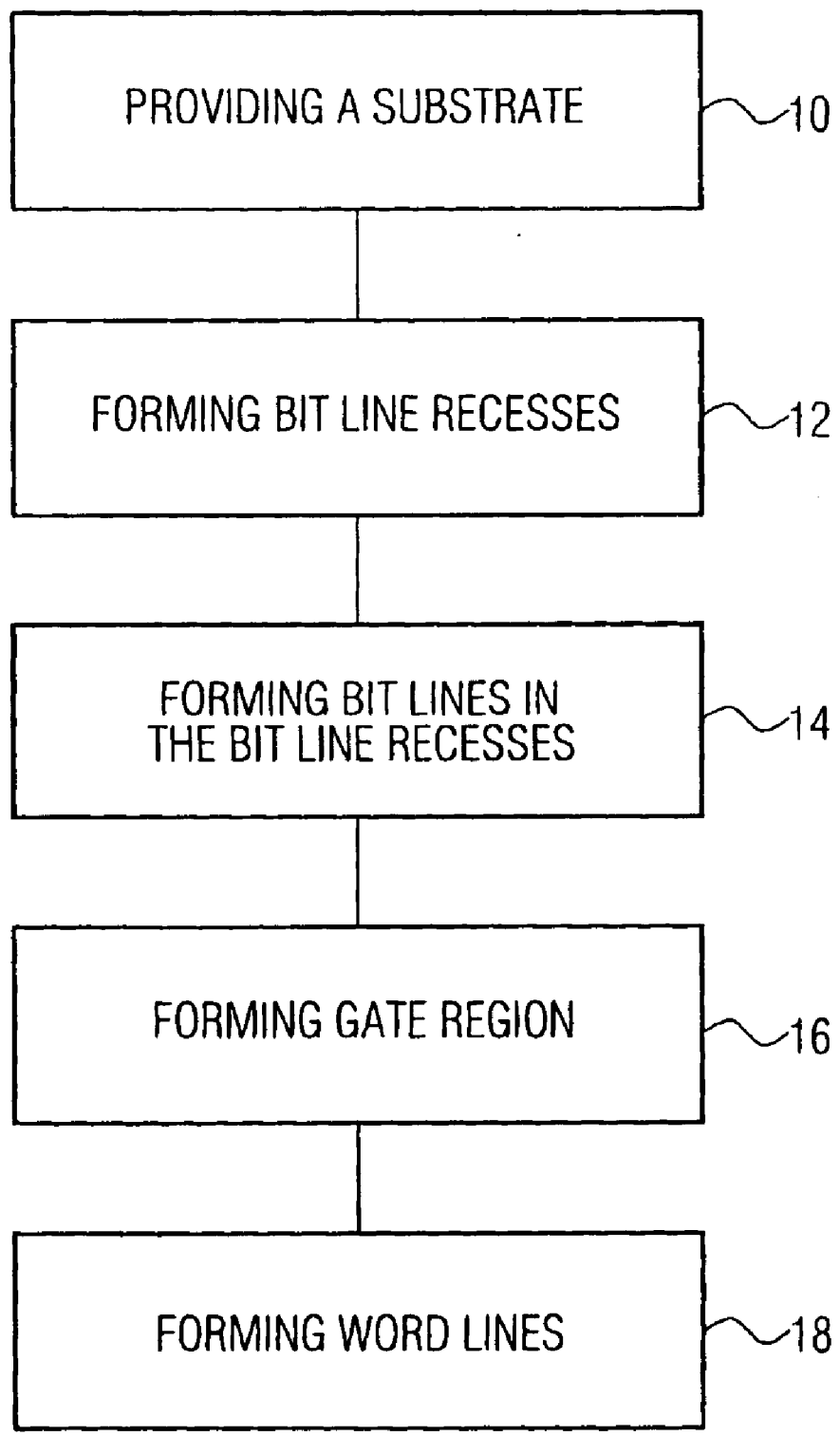

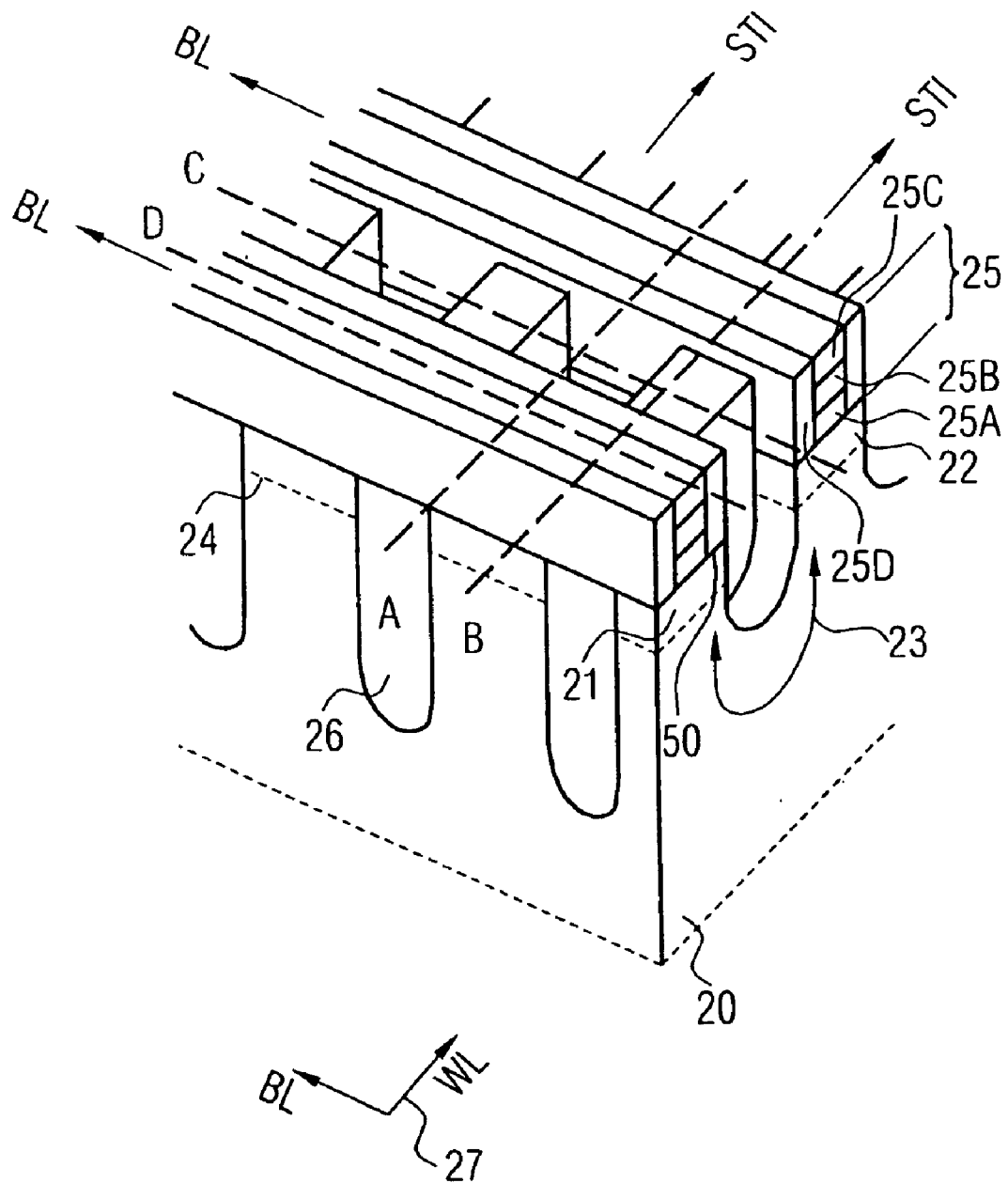

FIG 3A (ISOLATION)
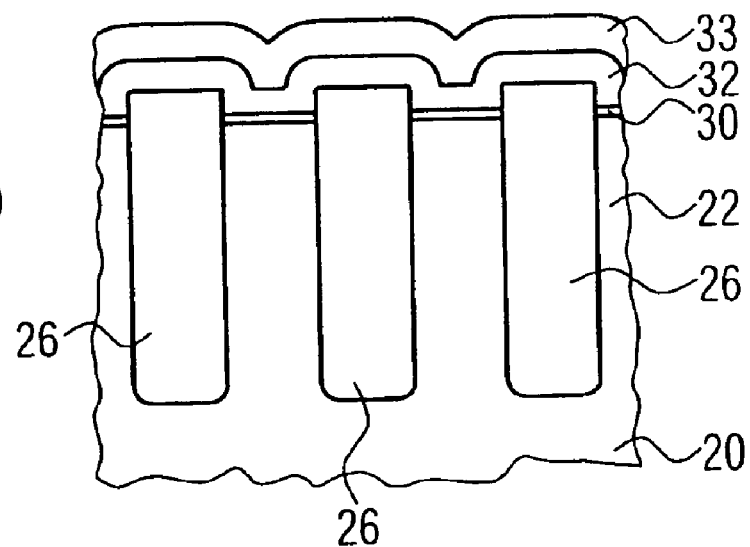
FIG 3B (ISOLATION)
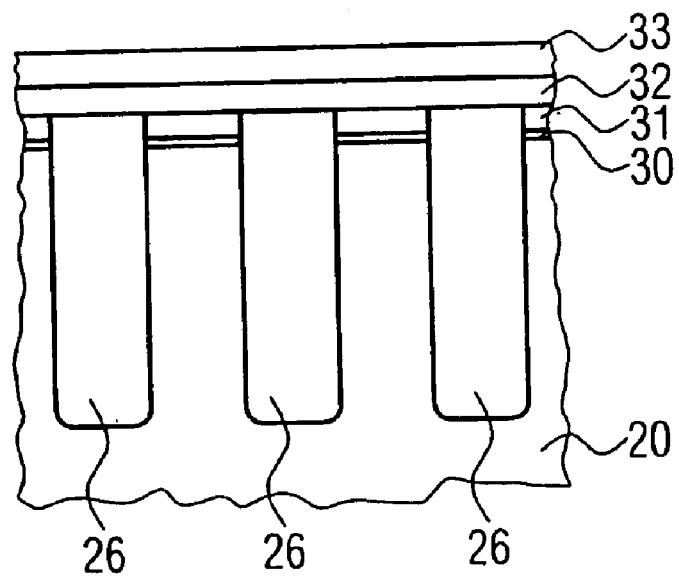

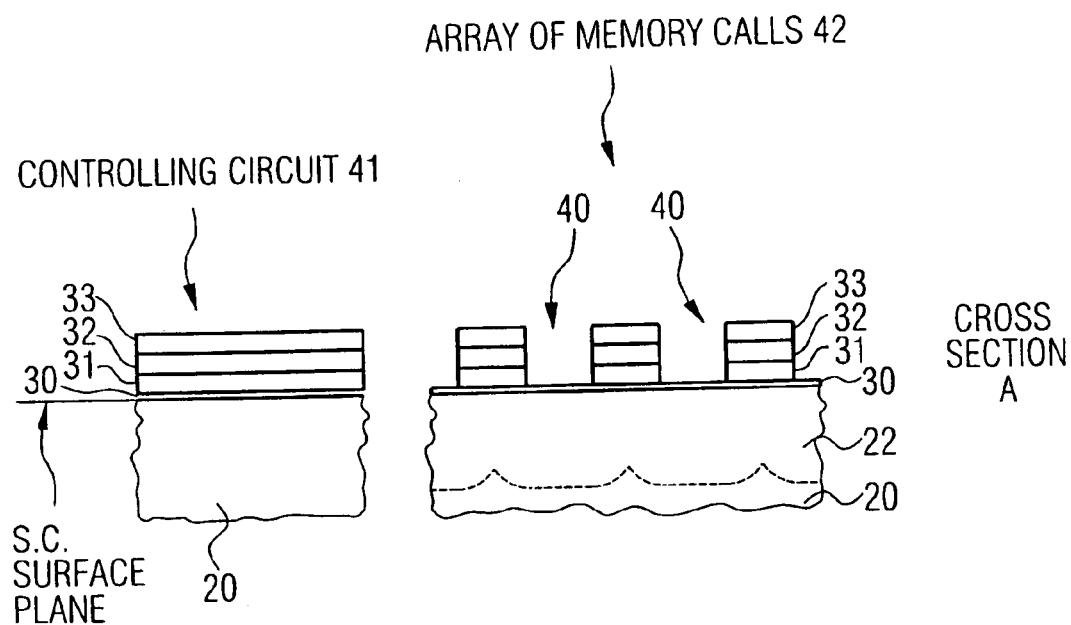
FIG 4A (BIT LINE MASK)
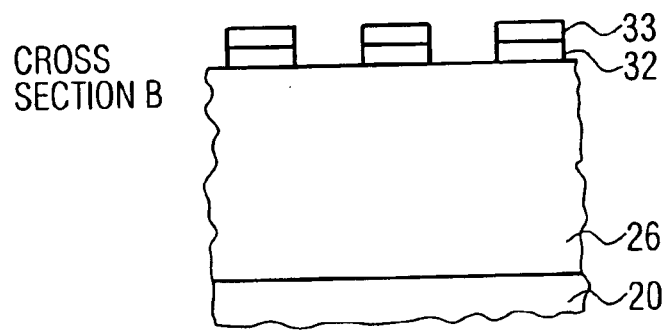
FIG 4B (BIT LINE MASK)

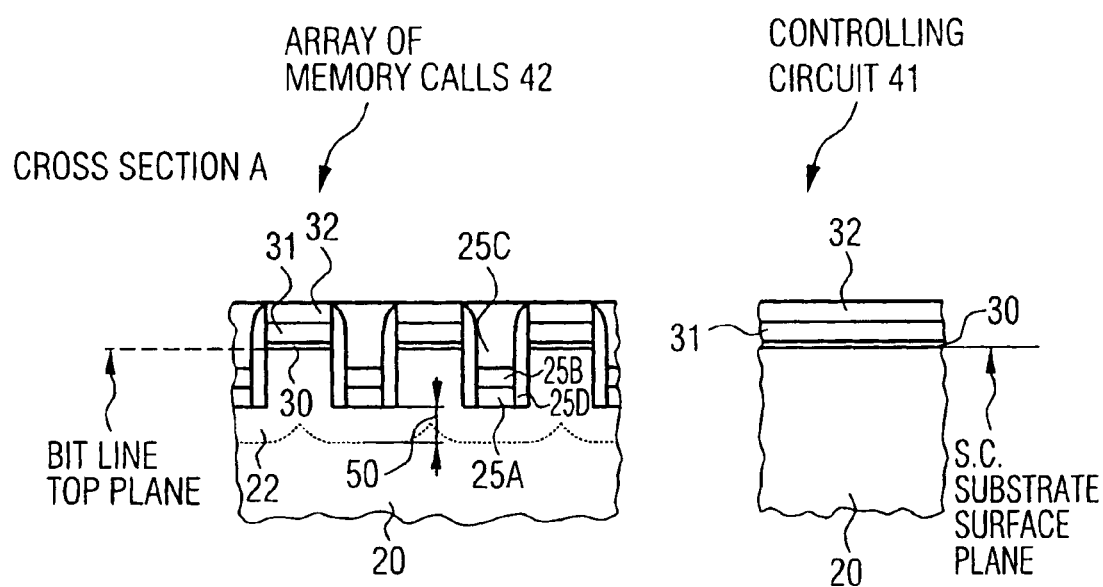
FIG 5A (BIT LINE FORMATION)
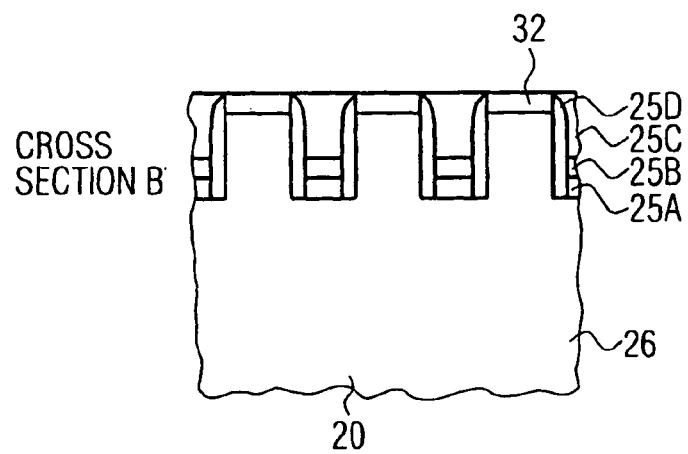
FIG 5B (BIT LINE FORMATION)

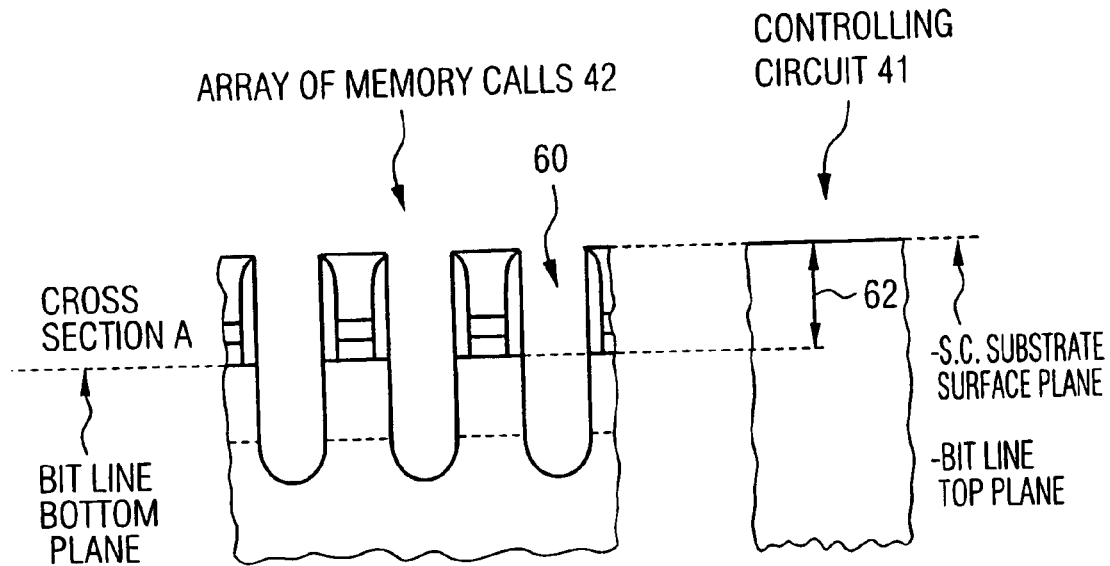
FIG 6A (ACTIVE GROOVE)
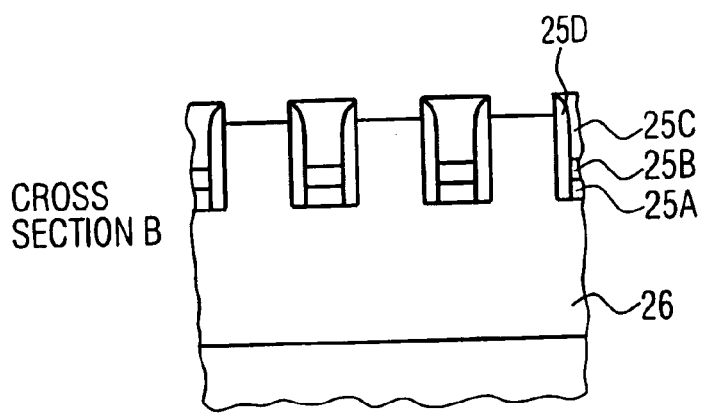
FIG 6B (ACTIVE GROOVE)

FIG 7A (STORAGE AND GATE DIELECTRICS)
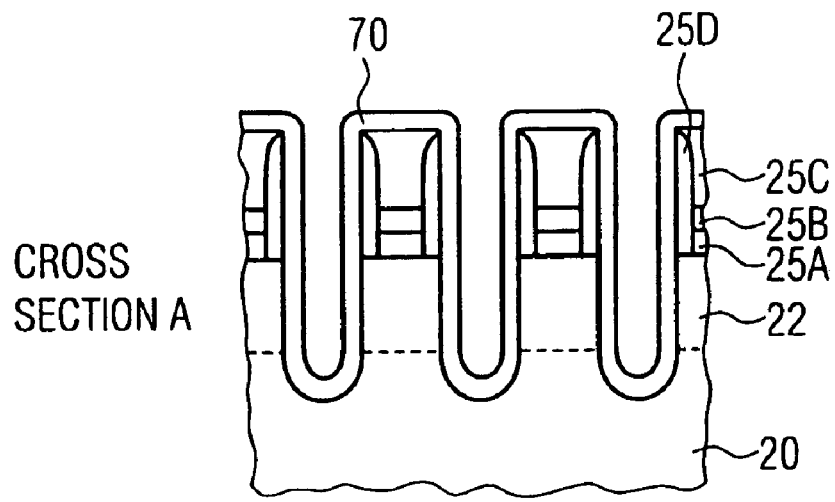
FIG 7B (STORAGE AND GATE DIELECTRICS)
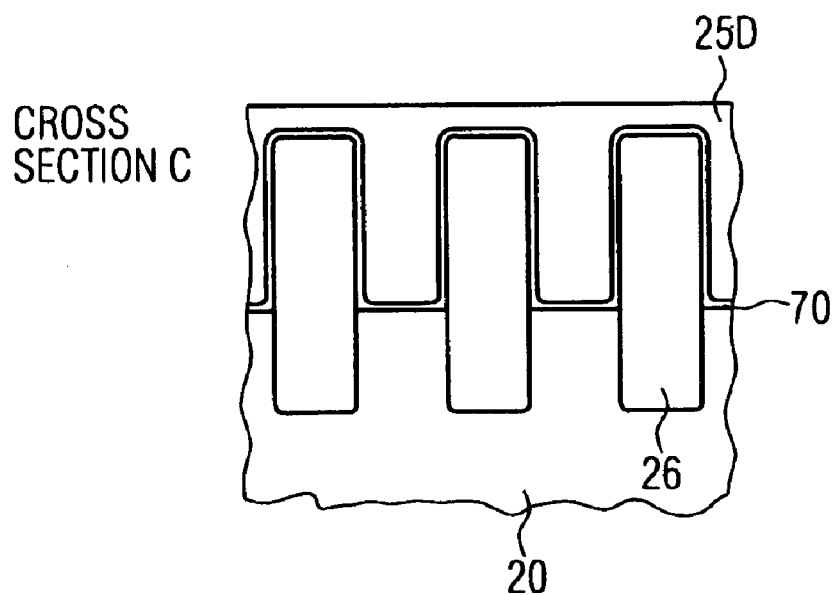

(WORD LINE AND GATE FORMATION)

NROM MEMORY CIRCUIT WITH RECESSED BITLINE

FIELD OF THE INVENTION

The present invention relates to integrated memory circuit, and in particular, to so-called NROM memories that are based on a dielectric layer for storing information.

BACKGROUND OF THE INVENTION AND PRIOR ART

In the technical publication "Can NROM, two-bit, trapping storage NVM cell, give a real challenge to floating gate cells?", B. Eitan et al., International Conference on Solid State Devices and Materials, Tokyo, 1999, discloses a memory circuit having an array of NROM memory cells. The NROM concept is a two bit Flash cell based on charge storage in an ONO dielectric. ONO stands for oxide-nitride-oxide. One memory cell is storing two physically separated bits with a unique method to sense the trapped charge. Programming is performed by Channel Hot Electron injection (CHE) and erase is performed by tunnelling enhanced Hot Hole Injection.

Gene rally, a NROM cell is a n-channel MOSFET device where the gate dielectric is replaced by a trapping material (nitride) sandwiched between two silicon dioxide layers. This is the above mentioned ONO structure. The top and bottom oxides are thicker than 1,5 nanometers to avoid any direct tunneling. The charge is stored in nitride next to the $n^+$ junctions. Each NROM cell includes a source region, a drain region and a channel region extending between the source and the drain region.

In this prior art memory cell, the drain regions on the one hand and the source regions on the other hand of neighboring memory cells are connected by so-called bit lines that are highly doped regions within the substrate semiconductor material. Generally, a p doped semiconductor substrate is used. The bit lines are realized as heavily doped n regions. Above the heavily doped n regions, an oxide for insulation purposes—the bit line oxide—is provided. This kind of bit lines are called "buried" bit lines.

Above the channel region, the ONO structure is applied. Above the ONO structure, the "gate electrode" that is also called word line is provided. In particular, word lines are provided such that they cross the bit lines at angles of approximately 90°. Such an area of memory cells being comprised of an array of parallel bit lines and an array of parallel word lines being formed above the bit lines and crossing the bit lines at 90° angles is called a virtual ground array. Usually, this virtual ground array is a field-oxide-less cross point architecture with a 5–6 $F^2$ cell size or 2.5–3 $F^2$ per bit.

The NROM cell is programmed by channel hot electron injection. At a high gate potential the transistor is driven into pinch off, if a sufficient source to drain voltage is applied. Electrons are heating up at high fields near the drain junction. As soon as the electrons have reached a certain velocity, they are injected into the nitride layer of the ONO structure because of the corresponding voltage applied to the word line, i.e., the gate of the NROM memory cell.

This electron injection into the nitride layer takes place near the metallurgical junction of the drain region to which the electrons move. Since the electrons can not freely move within the nitride layer, the electrons are trapped approximately at the edge of a crossing region of a word line and a bit line.

When the drain source voltage is reversed, electrons are accelerated in the reverse direction. When these electrons have reached a certain velocity, they are injected into the nitride layer near the crossing region of the word line and the other bit line of the memory cell. Since the electrons are not freely movable within the nitride layer of the ONO structure, one memory cell can store two bits. The storing locations are the edges of the crossing point of the word line and the first bit line of a memory cell, and the edges of the other crossing point of the word line and the other bit line of the memory cell.

Generally, it is a design aim to minimize the size of a memory cell. When the cell size can be reduced, the memory circuit having a certain storage capacity can be made smaller. The other way round, a memory circuit having the same size has a higher storage capacity, when a memory cell is made smaller.

A former limitation to memory cell minimization was the fact that a certain channel length is required for the device. The barrier heights of the layer materials are around 3.1 eV which requires the electrons to be heated up enough to surpass this barrier during programming. A typical drain voltage is, therefore, 5 V. To avoid punch through the effective channel length can not be reduced as much as desired.

To minimize the cell size while maintaining a certain required channel length, the U.S. patent application publication U.S. Ser. No. 2002/0024092 A1 teaches to use a grooved channel region. The channel shape is changed from a straight channel shape to a kind of a two dimensional channel shape, since the active channel is not formed by a straight connection but by U shape or V shape at the bottom of a channel groove. The ONO structure is applied onto the surface of the channel groove. With this groove shape, the memory cell size can be reduced in order to accommodate a higher capacity memory on a certain chip size.

The memory cell in the above identified US patent application publication has diffused bit lines, i.e., bit lines, that are produced by heavily doping certain regions of the semiconductor substrate.

It is well known that instead of heavily doping, these bit lines still have a certain ohmic resistance that is much higher than the ohmic resistance of a metallic layer for example. On the other side, relatively high voltages have to be applied to the drain or source region. The voltages lie in the range of 4.5 volts. To reduce ohmic losses in the bit lines, the so-called bit line strapping technique is used. With this technique, via holes are applied between adjacent word lines. These via holes extend between a top metal or metallized layer and the bit line, i.e., the diffused regions that are heavily doped. With this arrangement, the ohmic resistance of the bit lines is not mainly determined by the heavily doped diffused regions but is determined by the ohmic resistances of the metal or metallized layer and the contact via holes.

A disadvantage of this concept is that it becomes increasingly difficult to produce these via holes between adjacent word lines, since the patterning of the word lines is to be conducted by photolithography. Additionally, the word line photolithography is a very demanding task, since the structures are in the range of 150 to 50 nanometers. One can imagine that it is very difficult to apply a via hole which itself has a diameter of possibly 50 nanometers in a space of only 100 nanometers or less. Due to the relatively high maximum voltage (about 10 V) between bit lines and word lines a sufficient insulation layer thickness is required if reliability problems are to be avoided. In addition, the word line to bit line capacity should be kept low to avoid switching delay.

To address this problem, we have proposed in our commonly assigned, copending application Ser. No. 09/600,649, filed Jul. 6, 2001, to not use the bit line strapping technique but to apply a bit line structure having several layers onto the semiconductor substrate. Bit lines are formed of a polysilicon layer directly applied to the substrate semiconductor surface. On this polysilicon layer a metal containing layer is applied. This metal containing layer is, e.g. tungsten silicide and, additionally, a hard mask layer, e.g. an oxide, for electric insulation of the tungsten silicide layer from the respective environment. Thus, this bit line applied on top of the substrate is formed of a polysilicon layer, a tungsten silicide layer and a top oxide layer. Instead of WSi, also tungsten nitride and tungsten can be applied. Additionally, titan and/or titan silicide can be used.

It has been discovered that, though the problems involved with bit line strapping are overcome by this solution, another problem has appeared. It has been outlined above, that the word line lithography is a very demanding task. In particular, the quality of the lithography heavily deteriorates, when the surface, on which the lithography is conducted, is not a perfect surface but has steps or, generally, different levels.

Normally, an integrated memory circuit includes an array of memory cells located within a periphery. On this periphery, a controlling circuit for controlling the array of memory cells is located. It is clear that the bit lines as well as the word lines of the array of memory cells extend into the controlling circuit on the periphery so that the required voltages can be applied to the word lines as well as the bit lines.

While the manufacturing steps for forming for example the gate grooves are restricted to the memory cell array, at least the photolithography for producing the word line "touches" the memory cell array as well as the controlling circuit on the periphery. In particular the photolithography step for forming the word line is also used for defining gate structures of field effect transistors in transistor circuits of the controlling circuit that is normally based on CMOS techniques.

Applying the bit lines onto the substrate semiconductor surface inevitably results in a step between the controlling circuit of the integrated memory circuit and the array of memory cells. In particular, the mask for defining the word lines in the memory cell array is not perfectly plain but has a step at the border between the periphery and the memory cell array.

This step results in problems that lead to a lower yield or forbids further gains in size reduction of the memory cells. In both scenarios, the cost for a memory circuit increase. When the production yield is reduced, the price for a functioning memory circuit has to be raised. When, on the other hand, further gains in size reduction are not possible, the price of the memory cells also is increased because of higher area consumption of a memory cell having a certain capacity.

It is to be pointed out here that the memory circuit market is a very competitive market, in which small price differences may be responsible for the survival of the memory circuit producer.

SUMMARY OF THE INVENTION

It is an object of the present invention to provide a cheaper integrated memory circuit or a method of producing a cheaper integrated memory cell.

In accordance with the present invention, this object is achieved by an integrated memory circuit, comprising: a semiconductor substrate having a semiconductor substrate surface plain; an array of memory cells formed on the substrate, the array of memory cells including bit lines and word lines, the bit lines and word lines connecting the memory cells, the bit lines being formed of a material different from a material of the substrate and having a bit line top plane; a controlling circuit formed on the substrate for controlling the array of memory cells, wherein the bit lines and the word lines extend into the controlling circuit, wherein the bit lines are recessed with respect to the semiconductor substrate surface plane such that a difference between the bit line top plane and the semiconductor substrate surface plane is smaller than a predetermined value.

In accordance with a second aspect of the present invention, this object is achieved by a method of forming an integrated memory circuit, the method comprising: providing a semiconductor substrate; forming bit line recesses in the substrate; forming bit lines in the recesses, wherein two adjacent bit lines are connected to a source and a drain region of a memory cell in an array of memory cells; forming gate regions of the memory cells; forming word lines on the gate regions of the memory cells and gate structures of transistors in a control circuit for the array of memory cells, the word lines and the bit lines extending into the control circuit.

The present invention is based on the finding that for further gains in size reduction, it is of utmost importance that before any photolithography steps of highest resolution are carried out, the surface of the substrate has to be as even as possible. In particular, this situation exists for the photolithography for defining the word lines. To achieve a surface or plane of the substrate that is perfectly even or has only negligible steps, i.e., steps that are smaller than a predetermined value which is dictated by the photolithography settings, the bit lines of the inventive integrated memory circuit are recessed with respect to a substrate semiconductor surface plane of the periphery, in which the controlling circuit is produced. By forming recesses into the semiconductor substrate, and, then by forming bit lines in these recesses, a perfect or almost perfect surface for the word line lithography can be obtained. In particular, providing recesses for the bit line allows to form bit lines of a material different from the semiconductor substrate, i.e. bit lines that are preferably metallized or include a metal/semiconductor compound that has a low ohmic resistance. Therefore, the problematic bit line strapping technique can be avoided.

It is an advantage of the inventive concept that by providing recesses for the bit lines, it is possible to obey the essential rules for device functionality and manufacturability in a leading edge fabrication site that is capable of line widths of around 100 nanometers.

It is a further advantage of the present invention that by providing recessed bit lines, no steps of more than about 100 nanometers, preferably 50 nanometers and most preferably 30 nanometers are present, before a critically, i.e., minimum line width lithography like that of the word lines is applied.

It is a another advantage of the present invention that a channel length of around 200 nanometers is possible though the bit line pitch should be scaleable with a cell size of less than 5 $F^2$. It is another advantage of the present invention that a virtual ground NOR array with metallized bit lines can be produced in order to avoid bit line strapping which would require extra space between word lines for contact holes.

It is another advantage of the present invention that the channel length that is defined by both $n^+$ implant depth and the active trench etch process is manufacturable with minimum process and uniformity variation, i.e., with high reproducibility. This is made possible by the fact that the two process steps, i.e., the implant step for forming the source and drain regions and the active channel etch step are related to the same original surface.

It is another advantage of the present invention that an insulation between neighboring channels can be easily integrated utilizing the well-known shallow trench insulation technique. Such shallow trench insulation between neighboring word lines reduces cross talk between adjacent memory cells, which would reduce the performance of the memory cells because of increasing fields that are accompanied by reduced word line spacing.

While currently NROM cells are fabricated as planar type NMOS transistors using an ONO stack dielectric as gate dielectric, the inventive concept allows to use the grooved channel technique together with metallized bit lines. Nitride in this case is used as an electron storage layer. Due to material specific properties, source-drain voltages of 4 to 6 V are necessary during program and erase operations. The transistor channel lengths can thus not be scaled with the decreasing design rule available in modern semiconductor fabrication sites, but are bound to around 200 nanometers. Using grooved channel regions together with recessed bit lines that are, in addition, made by metal or metal compound layers, in combination with shallow trench insulation will result in further memory size reductions that are mainly made possible by the recessed bit lines and, as a consequence, a perfect surface for the final word line lithography.

BRIEF DESCRIPTION OF THE DRAWINGS

Preferred embodiments of the present invention are subsequently explained with respect to the following drawings, in which:

FIG. 1 is high level flow diagram of a method for manufacturing an integrated memory circuit;

FIG. 2 is a three-dimensional view of a portion of the integrated memory circuit before the ONO stack is applied onto the channel region;

FIG. 3a shows a cross section along line C or D in FIG. 2 after shallow trench insulation for the option of pad nitride removed;

FIG. 3b a cross section along line C or D of FIG. 2 after shallow trench insulation for the option of pad nitride not removed;

FIG. 4a a cross section along line D of FIG. 2 after forming the bit line mask;

FIG. 4b a cross section along line B of FIG. 2 after forming the bit line mask;

FIG. 5a a cross section along line A of FIG. 2 after forming the bit line recesses and the metallized bit lines;

FIG. 5b a cross section along line B of FIG. 2 after forming the bit line recesses and the metallized bit lines;

FIG. 6a a cross section along line A of FIG. 2 after forming the active grooves;

FIG. 6b a cross section along line B of FIG. 2 after forming the active grooves;

FIG. 7a a cross section along line B of FIG. 2 after applying the storage and gate dielectrics;

FIG. 7b a cross section along line C of FIG. 2 after applying the storage and gate dielectrics.

DETAILED DESCRIPTION OF PREFERRED EMBODIMENTS

Figure 8:
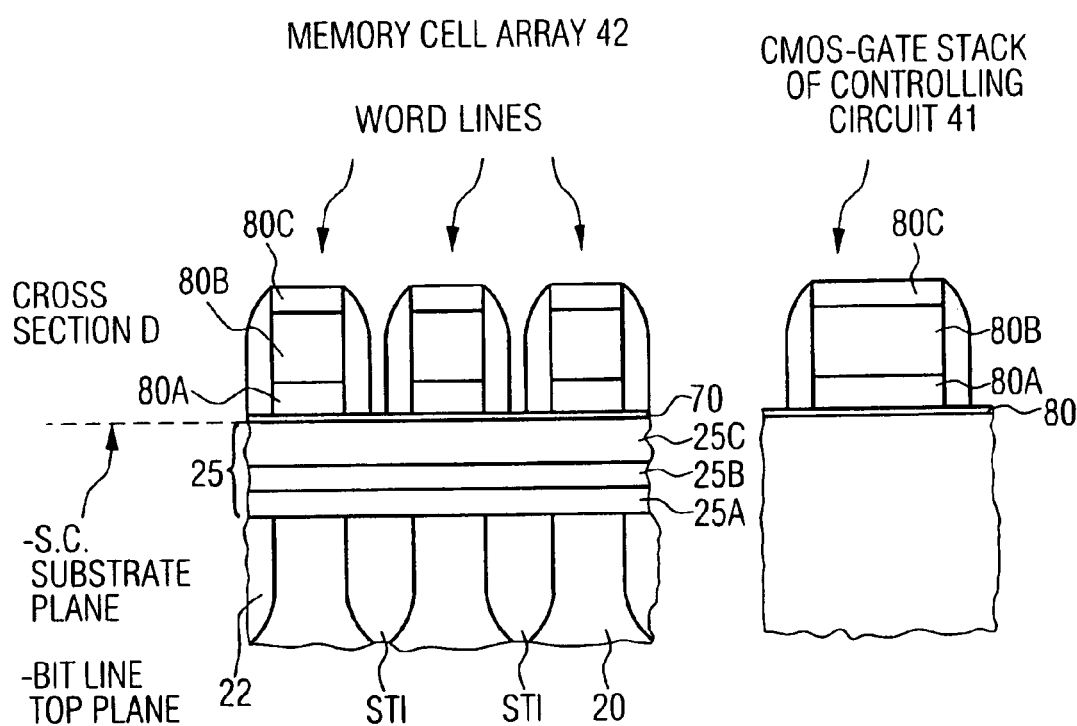
FIG. 8 a cross section along line D of FIG. 2 after forming the word lines of the memory cell array and the gate of the controlling circuit on the periphery.

In the following, reference is made to FIG. 1. The inventive method of forming an integrated memory circuit starts with the step of providing (10) a semiconductor substrate. In this substrate, bit line recesses are formed (12). After that, bit lines are formed in the bit line recesses, wherein one bit line of a memory cell is connected to a source region of the memory cell, and an adjacent bit line of a memory cell is connected to a drain region of a memory cell in the array of memory cells. In particular, the bit lines are formed (14) by a material different from the semiconductor material. That means that the bit lines are formed of a metal or a metal/semiconductor compound having a low ohmic resistance. When the bit lines are complete, gate regions are formed (16). Finally, word lines on the gate region of the memory cells and gate structures of transistors in the control circuit for the array of memory cells are formed by a lithography method (18).

By this method, an integrated memory circuit is obtained that includes a semiconductor substrate having a semiconductor substrate surface plane. The integrated memory circuit further comprises an array of memory cells formed on the substrate, the array of memory cells including bit lines and word lines, the bit lines and word lines connecting the memory cells, the bit lines formed of a material different from a material of the substrate and having a bit line top plane. The integrated memory circuit further comprises a controlling circuit formed on the substrate for controlling the array of memory cells, wherein the bit lines and the word lines extend into the controlling circuit such that the required voltages for reading, programming and erasing of the memory cells can be applied thereon. Inventively, the bit lines are recessed with respect to the semiconductor surface plane such that the difference between the bit line top plane and the substrate surface plane is smaller than a predetermined value.

In certain circumstances, the predetermined value is determined by the photolithography method for defining the word lines. The predetermined value is to be kept as small as possible and should be preferably zero. Under real circumstances, this theoretically perfect zero value will be hard to obtain. However, choosing this value to be 100 nanometers or preferably 50 nanometers and most preferably 30 nanometers will result in a word line lithography that makes possible a high capacity integrated memory circuit with high production yield, and, therefore, low costs.

In the following, reference is made to FIG. 2. FIG. 2 is a three dimensional cross sectional view of the cell array after the bit line is fabricated, the active trench is etched and a sacrificial oxide is grown and etched. In other words, the cell array shown in FIG. 2 shows the situation before the ONO stack and the word lines are deposited. Importantly, FIG. 2 also shows the position of the cross section (line A, B, C and D) that are used to identify the cross sections in FIG. 3a to FIG. 8.

In the following, the structure of FIG. 2 is described in detail. The memory cell array is produced on a substrate 20 that is preferably a p-doped wafer. One memory cell includes a source region 21 and a drain region 22 as well as a channel region 23. The source region and the drain region (21, 22) are defined by doped areas that are indicated by a broken line 23. The broken line 23 indicates the doping depth. For doping the source and the drain regions 21, 22 an implantation with As n$^+$ with a dose of 1e15/cm$^2$ is preferred. Onto the source and the drain regions, bit lines 25 are formed. In the preferred embodiment of the present invention, the bit lines are formed of several layers. These are a lower polysilicon layer 25a on top of the implantation regions followed by a metal or metal/semiconductor layer 25b and an insulating oxide layer 25c. Side insulation of the bit lines is performed by spacers 25d to the left and the right of the bit line 25. The upper plane of the bit line oxide layer 25c defines the bit line top line that preferably has the same level as the semiconductor surface before producing the bit lines, the active grooves and the shallow trench insulation between neighboring bit lines. This semiconductor substrate surface plane corresponds to the surface plane of the periphery on which the controlling circuit for controlling the state of memory arrays is formed.

As can be seen from FIG. 2, the channel region 23 is formed by a groove or a trench. This has the effect that the channel is longer than a direct connection between the source and the drain region because of the approximately round shape of the channel region. Additionally, adjacent channels regions are separated from each other by the shallow trench insulation 26. Preferably, the shallow trench insulation is formed by trenches filled with oxide. The shallow trench insulation has to be performed to such a depth that the trenches extend deeper into the semiconductor substrate 20 than the channel or the doped drain and source regions.

Finally, an arrow 27 indicates the direction of the word lines that cross the bit lines (BL) in angles of preferably 90°.

Therefore, one memory cell includes two adjacent bit lines, a drain region, a source region, a channel region and a word line. Such a memory cell is able to store two bits, i.e., one bit at the crossing region of a word line and the first bit line of a memory cell, and another bit at the crossing region of the second bit line and the word line.

In the following, reference is made to the circuit's appearance during several manufacturing steps. The whole process starts with providing the substrate 20. On this substrate, a pad oxide 30 is grown and a pad nitride 31 is deposited on the p-doped wafer. Then, all the known steps to achieve an oxide filled shallow trench insulation 26 are applied including lithographies for trench definition and planarization. The etching of the trenches is preferably performed in a way to obtain essentially perfect walls with an angle between 89° and 90°. After the trench forming and filling process, the surface is planarized by chemical mechanical polishing (CMP). At this stage the surface consists either of STI oxide or pad nitride 31.

There are two options for the following well implants of the array and the CMOS periphery. The pad nitride (31) can be removed or left. When the pad nitride is left, one has the advantage of a more planar surface when the bit lines are defined. After depositing the second nitride layer (32), the oxide layer 33 and another layer that serves as an anti reflective coating (not shown in FIG. 3a), the memory circuit appears as shown in FIG. 3a and FIG. 3b. Regarding FIG. 3b, the oxide/nitride stack can be seen in detail. In particular, on the surface of the semiconductor substrate 20, there is the pad oxide layer 30 broken by the shallow trench insulation 26. On top of the pad oxide layer, there is the pad nitride layer 31. On top of the pad nitride layer, there can be found the nitride layer 32. Again, on top of the nitride layer 32, there is the oxide layer 33. This oxide layer serves as a hard mask for the bit line delineation. It is to be noted that the pad nitride layer 31 is not present in the cross section along line C or D in FIG. 2, if the second option is chosen.

From FIG. 3b it also becomes clear that the shallow trench insulation is not flush with the substrate semiconductor surface plane but extends above this plane by the height of the pad oxide layer 30 and the pad nitride layer 31. However, due to densification and cleaning steps, this height is reduced during processing.

In the following, reference is made to FIG. 4a and FIG. 4b to indicate the situation after the bit line mask for producing the bit line recesses is applied. FIGS. 4a and 4b relate to the option of pad nitride not removed as indicated in FIG. 3b. For the removed pad nitride option layers 31 and 32 have to be replaced by layer 32 alone.

FIG. 4a is a cross section along the line A of FIG. 2, while FIG. 4b is a cross section along the line B of FIG. 2. The lithography for defining the bit lines is used to open a hard mask (layers 33, 32, 31). In particular, firstly the oxide 33 at positions 40, where the bit line recesses have to be formed is etched. The selective etch stops on the surface of the nitride layer 32. Then, another etching process is used for etching the nitride layers 32 and 31 in the regions 40, if 31 had not been removed earlier. This etch stops on the pad oxide, since a selective reactive ion etching chemistry is chosen. Thus, the nitride layer 32 and the pad nitride layer 31 are etched in one selective etch step that uses the pad oxide layer 30 as an etch stop.

Then, another lithography is used to protect the periphery while As is implanted for the buried bit line regions (22 in FIG. 2). Thus, this implant step is only performed in an array of memory cells 42 but is not performed in the periphery, where a controlling circuit 34 is located. After implanting, the implant is annealed.

From FIG. 4a it becomes clear that the implant is performed after the bit line mask defined by layers 33, 32, 31 has been completed. Alternatively, this implant could have also been performed before applying the pad nitride layer 31 onto the pad oxide layer 30, i.e., before doing the insulation in FIG. 3a and FIG. 3b by means of the STI technique.

FIG. 4b shows a cross section along the line B in FIG. 2. It is to be noted here that the layers 30 and 31 are not visible in the cross section of FIG. 4b but are hidden by the shallow trench insulation 26.

To process the circuit in FIGS. 4a, 4b in order to arrive at the circuit in FIGS. 5a, 5b, the oxide 30, i.e., the pad oxide, the STI oxide 26 and the substrate 20, and in particular, the doped region 22 is etched with comparable etch rates and enough selectivity to the nitride hard mask (layers 31 and 32). It is preferred to allow that the oxide has a somewhat higher rate to achieve the same depth in the STI oxide and the substrate.

Regarding the controlling circuit 41, it is preferred to keep the periphery protected also by a nitride hard mask that is also shown in FIG. 5a. Then, when the etching process for etching the bit line recesses is stopped at a certain predetermined depth in the semiconductor substrate 20 as well as in the STI oxide, an oxide is deposited into the recesses and subsequently etched to obtain the spacers 25d. Then, only polysilicon is deposited and etched back such that the polysilicon layer 25a is obtained. Then, Co is deposited, annealed and etched to obtain CoSi 25b using the self-aligned silicide method (salicide method). Alternatively, WSi is deposited and etched back in a way that a metal or metal/semiconductor layer 25 for low ohmic resistance bit lines is obtained. The remaining gaps are filled with oxide and the resulting circuit structure is planarized to obtain layer 25c. CMP can be used to planarize the surface. Since this processing step features only moderate selectivity to nitride, the layers 31, 32 are thinned to a degree that only a part of layer 31 may remain.

A part of the oxide within the recesses is the insulation constituent of the bit line. This part is indicated by reference no. 25c and extends from the upper plane of layer 25b to the semiconductor substrate surface plane, which remains after the CMP step.

It is an important feature of the present invention that the implanting step for obtaining region 22 (see FIG. 4a) and the step for etching the recesses is performed starting from the same or almost the same surface plane. The only difference is the very thin pad oxide 30. From FIG. 5a, it becomes clear that the distance between the lower recess plane of the bit line recesses and the border of the n+ implant defines the channel length. This distance is indicated by a double arrow 50 in FIG. 5a.

When FIG. 2 is considered, it becomes clear that this distance is responsive for the channel length that is indicated by the other double arrow 23 in FIG. 2. When the distance 50 increases, this immediately results in a reduction of channel length. On the other side, the channel length is increased, when the distance 50 decreases. Thus, the distance 50 is a main point when reproducibility on the one hand and memory cell within the integrated circuit on the other hand are considered. Therefore, it is an important consequence that the bit line recess etch as well as the implantation step for defining the source and drain region start from the same (or almost the same plane except for the thin pad oxide 30) This feature makes sure that the reproducibility is high and variations within the integrated memory circuit are low.

From FIG. 5b it becomes clear that the shallow trench insulation not only separates the adjacent channel regions but also extends between the source and the drain regions of a memory cell. Bit lines are recessed in the STI oxide as well as in the substrate silicon if the preceding steps are applied.

In the following, the steps are described to reach the situation shown in FIG. 6a and FIG. 6b, in which an active groove 60 is formed. Firstly, the residual layer of nitride layers 32 and 31 are removed preferably by reactive ion etching. It is additionally preferred that the nitride layer is removed in the array of memory cells 42, but not in the controlling circuit area 41.

This can be achieved using a photolithographic step which protects the peripheral area. Etching can be performed with high selectivity to oxide such that an etch stop is provided by the oxide. A situation is found where the whole array is covered by oxide, i.e., the side wall spacers 25d and the filling oxide 25c cover the bit line structures and the pad oxide covers the substrate between all surfaces but those where STI oxide 26 was left between the bit line structures.

Then, the active trenches 60 are etched. Firstly, a break through step has to be performed to break the pad oxide. This reduces the height of all oxide surfaces by an amount comparable to the pad oxide thickness.

Then, a self-aligned etch is performed that selectively etches the semiconductor material only but does not etch the oxide in the bit line recesses on the one side and the shallow trench insulation on the other side. For FIG. 6a it becomes clear that the bit line "recesses" can not be seen in the final integrated memory circuit any more. Instead, only the content of the recesses, i.e., the layers 25a, 25b, 25c and spacers 25d remain. This is because of the fact that the material between the recesses is etched away to form the active groove as can be seen in FIG. 2 or FIG. 6a. However, it is important to note that with respect to the semiconductor surface plane, the bit lines are indeed recessed by an amount that is defined by the distance between the bottom line of the polysilicon layer 25a and the semiconductor surface plane or, in the other words, the bit line top plane. This recess depth is indicated in FIG. 6a as 62.

Since reactive ion etching is known to cause crystal damage to a semiconductor surface it is advantageous to grow a thin thermal oxide on etched and now open surfaces. This sacrificial oxide helps to anneal out crystal defects in the extremely sensitive channel region of the substrate. Using standard wet cleaning recipes the sacrificial oxide as well as the remaining nitride and the pad oxide of the peripheral areas can be removed. After this step a situation is obtained which is illustrated in FIG. 6a. The active grooves between bit line structures and the peripheral transistor areas are uncovered Si surfaces.

FIG. 6b indicates the same intermediate manufacturing result as in FIG. 6a but along cross section B.

To reach the intermediate status in FIG. 7a, on the structure shown in FIG. 6a and FIG. 6b, the ONO stack 70 is grown/deposited. After forming the ONO stack, lithographies are used to remove the ONO stack in the peripheral control circuit. In the controlling circuit 41, the ONO stack is not used but is replaced by one ore more different gate oxides for the field effect transistors in respective CMOS circuits.

ONO can be etched using wet or dry processes or a combination of both while the memory array is protected by a resist mask. After removing resist and cleaning a thicker (about 15 nm) "high voltage" gate oxide can be grown. The masking procedure can be repeated to etch the high voltage gate oxide while both the cell array and the high voltage transistor regions remain protected by the resist. Again after cleaning a low voltage gate oxide can be grown. In all cases the subsequent oxidation steps contribute to an increase of the preceding layer thickness. The mask steps can be used to apply additional channel implants and to obtain appropriate threshold voltages.

FIG. 7b shows the same intermediate manufacturing result but in cross section C. From cross section C it becomes clear that the spacers 25d may extend above the STI or the ONO stack 70 that is also applied on the STI. However, this extension may disappear if certain wet cleans etch less densified oxides faster than those which were exposed to a higher thermal budget before.

In the following, reference is made to FIG. 8 showing the situation after the word line in the memory cell array 42 or the CMOS gate stack of the controlling circuit 42 on a gate dielectric 80 is shown. Firstly, a polysilicon layer 80a is applied on the ONO stack 70 that resides on top of layer 25c of the bit line 25. Due to the excellent conformal coating properties of poly the active grooves as shown in FIG. 7a can be filled completely if the poly thickness is somewhat larger than half of the opening.

Above the polysilicon layer 80a, a tungsten silicide layer 80b is applied generally using the same technology as has been described with respect to the bit line metal or metal/semiconductor layer 25b. On top of the layer 80b, a hard mask 80c is applied.

An even lower sheet resistance of a word line stack can be obtained if a different layer scheme is utilized: the sequence of poly, WN and W followed by a hard mask.

Up to now, the layers 80a, 80b, 80c are applied on the whole circuit, i.e., the memory cell array 42 and the controlling circuit 41. Now, the final cell defining photolithography follows. It is a major advantage of the present invention that, for this word line lithography, the plane of the whole integrated memory circuit is perfectly even or has only steps below a critical step size. As has already been mentioned above, the word line lithography is a difficult task, since the word line pitches are in the range of 200 nanometers, and, for further reducing the size of the memory cell array, can drop below 200 nanometers. The recessed bit lines in accordance with the present invention are responsible for perfect or almost perfect conditions for this lithography, so that the production yield can be kept high, and, therefore, the cost for the integrated memory circuit can be kept in a reasonable frame.

In FIG. 8, side wall spacers are drawn. Depending on the number of gate oxides and especially on the categories of NMOS and PMOS devices in the peripheral circuitry one or more sidewall spacers are necessary in addition to a reoxidation step after gate etching. For the high voltage (about 12 V) rather thick spacers are usually used which fill the gap between word lines completely. However, these have no impact on the cell devices or on the various implants of the peripheral transistor extensions. The process usually continues with state of the art methods of inter-layer isolation, contact holes and metal fills as well as metal wiring levels.

In another embodiment of the present invention, dual work function gates in conjunction with salicided word lines are also possible.

While the CMOS scheme described above is based on a $n^+$-poly gate material for all types of transistors the method can be extended to higher performance PMOS devices in the peripheral circuit—the $p^+$ gate PMOS devices—which do not feature buried channels as in the former case. Since the memory cell is addressed by local metallic bit lines, one does not need self aligned contacts between narrow spaced word lines. Thus, nitride encapsulated word lines are not necessary. Therefore, undoped poly can be applied for gate contacts and doped at the same time when $p^+$ or $n^+$ source/drain extensions are implanted. Gates can be metallized using the salicide method in conjunction with CoSi.

List of Reference Numerals
10 providing a substrate
12 forming bit line recesses
14 forming bit lines in the recesses
16 forming gate regions
18 forming word lines
20 substrate
21 source region
22 drain region
23 channel region
25 bit lines
25a lower polysilicon layer
25b metal or metal/semiconductor layer
25c insulating oxide layer
25d side wall spacers
26 shallow trench insulation
27 direction of word line
30 pad oxide
31 pad nitride
32 nitride layer
33 oxide layer
40 positions of bit one recesses
41 controlling circuit
42 array of memory cells
50 remaining doping depth
60 active groove
62 recess depth
70 ONO stack
80 sgate dielectric for controlling circuit transistors
80a polysilicon layer
80b tungsten silicide layer
80c hard mask

What is claimed is:

1. Integrated memory circuit, comprising:
   a semiconductor substrate having a semiconductor substrate surface plain;
   an array of memory cells formed on the substrate, the array of memory cells including bit lines and word lines, the bit lines and word lines connecting the memory cells, the bit lines being formed of a material different from a material of the substrate and having a bit line top plane;
   a controlling circuit formed on the substrate for controlling the array of memory cells, wherein the bit lines and the word lines extend into the controlling circuit; and
   wherein the bit lines are recessed with respect to the semiconductor substrate surface plane such that a difference between the bit line top plane and the semiconductor substrate surface plane is smaller than 50 nanometers.

2. Integrated memory circuit in accordance with claim 1, wherein a memory cell includes:
   a source region connected to a bit line;
   a drain region connected to a neighboring bit line;
   a groove-shaped channel region formed between the source region and the drain region, the channel region including a lower insulating layer, a storing layer and an upper insulating layer.

3. Integrated memory circuit in accordance with claim 2, in which the source region of a memory cell is connected to a first bit line,
   in which the drain region of the memory cell is connected to a second neighboring bit line,
   in which a word line of the memory cell crosses the first bit line and the second bit line, the word line being positioned above the first bit line and the second bit line.

4. Integrated memory circuit in accordance with claim 3, in which the memory cell includes two bit storing positions that are located at crossing regions between the word line and the first bit line or the second bit line.

5. Integrated memory circuit in accordance with claim 2, in which the upper and the lower insulating region are formed of oxide, and the storing region is formed of nitride.

6. Integrated memory circuit in accordance with claim 2, in which the bit line includes a lower polysilicon layer, a silicide layer on the lower polysilicon layer and a fill oxide layer above the silicide layer.

7. Integrated memory circuit in accordance with claim 6, in which the lower insulating layer, the storing layer and the upper insulating layer are also provided on the fill oxide layer of the bit line.

8. Integrated memory circuit in accordance with claim 1, in which a word line includes a lower polysilicon layer, a silicide layer above the polysilicon layer and an antireflective coating layer above the silicide layer.

9. Integrated memory cell in accordance with claim 1, in which the word line includes a layer of polysilicon, a layer of tungsten nitride, a layer of tungsten and, above the layer of tungsten, a hard mask.

10. Integrated memory cell in accordance with claim 1, in which trenches filled with insulating material are provided between adjacent word lines, the trenches extending deeper into the semiconductor substrate than a groove-shaped channel region of a memory cell.

11. Integrated memory cell in accordance with claim 1, in which the bit lines are arranged in recesses formed in trenches, and extend above the trenches.

12. Integrated memory cell in accordance with claim 1, in which the word lines have a word line bottom plane, where the difference between the word line bottom plane and the semiconductor surface plane is smaller than the predetermined value.

13. Integrated memory cell in accordance with claim 1, in which distances between two neighboring bit lines or two neighboring word lines are smaller than 150 nanometers.

14. Method according to claim 13,
in which the bit line recesses and the bit lines are designed such that the difference between a bit line top plane and a substrate surface plane is smaller than a predetermined value.

15. Method in accordance with claim 13,
in which the step of providing a substrate includes providing an oxide layer on a substrate surface and a nitride layer above the oxide layer;
in which the step of forming bit line recesses
includes the following substeps:
lithographically defining the bit line recesses;
selectively etching using the oxide layer as an etch stop;
selectively etching using nitride as an etch stop until a predetermined recess depth is obtained.

16. Method in accordance with claim 15, in which the step of forming bit lines includes the following substeps:
forming side wall spacers in the bit line recesses;
forming a layer of polysilicon in the bit line recesses;
forming a metal-silicon compound layer or a metal layer on the layer of polysilicon using a silicide method; and
filling remaining gaps of the bit line recesses with oxide.

17. Method in accordance with claim 13, in which a step of implanting is performed before the step of forming bit lines.

18. Method in accordance with claim 17, in which the metal of the silicon/metal compound is Co or Tungsten.

19. Method in accordance with claim 13, wherein in the step of forming bit lines, metallized bit lines are produced.

20. Method in accordance with claim 13, in which the step of forming gate regions includes the following substeps:
lithographically removing a nitride layer on the semiconductor substrate within the memory cell array;
selectively etching grooves into the semiconductor substrate using a top oxide layer of the bit lines as an etch stop; and
forming an oxide-nitride-oxide layer in the grooves.

21. Method in accordance with claim 13, in which the step of forming word lines includes the following substeps:
filling remaining grooves in the gate regions with polysilicon;
proving a metal-silicon compound layer on the polysilicon layer and hard mask on the metal-silicon compound layer; and
lithographically defining the word lines and etching the word lines using an oxide layer on the bit lines as an etch stop.

22. Integrated memory circuit in accordance with claim 13, further comprising the following step:
forming the controlling circuit for controlling the array of memory cells as a CMOS circuit.

23. Integrated memory circuit in accordance with claim 13, in which the step of providing a semiconductor substrate includes a step of forming a shallow trench insulation between adjacent word lines.

24. Integrated memory cell in accordance with claim 1, in which the predetermined value is defined by a lithography technique performed for patterning the word lines.

25. Method in accordance with claim 24, in which the predetermined value is 50 nanometers or smaller.

26. Method of forming an integrated memory circuit, the method comprising:
providing a semiconductor substrate;
forming bit line recesses in the substrate;
forming bit lines in the recesses, wherein two adjacent bit lines are connected to a source and a drain region of a memory cell in an array of memory cells;
forming gate regions of the memory cells; and
forming word lines on the gate regions of the memory cells and gate structures of transistors in a control circuit for the array of memory cells, the word lines and the bit lines extending into the control circuit.

27. An integrated memory circuit, comprising:
a semiconductor substrate having a semiconductor substrate surface plain;
memory cells including a source region connected to a bit line, a drain region connected to a neighboring bit line, a groove-shaped channel region formed between the source region and the drain region, the channel region including a lower insulating layer, a storm layer and an upper insulating layer;
an array of the memory cells being formed on the substrate, the array of the memory cells including bit lines and word lines, the bit lines and word lines connecting the memory cells, the bit lines being formed of a material different from a material of the substrate and having a bit line top plane, a lower polysilicon layer, a suicide layer on the lower polysilicon layer and a fill oxide layer above the silicide layer;
a controlling circuit formed on the substrate for controlling the array of memory cells, wherein the bit lines and the word lines extend into the controlling circuit; and
wherein the bit lines are recessed with respect to the semiconductor substrate surface plane such that a difference between the bit line top plane and the semiconductor substrate surface plane is smaller than a predetermined value.

28. Integrated memory circuit in accordance with claim 27,
in which the source region of a memory cell is connected to a first bit line,
in which the drain region of the memory cell is connected to a second neighboring bit line,
in which a word line of the memory cell crosses the first bit line and the second bit line, the word line being positioned above the first bit line and the second bit line.

29. Integrated memory circuit in accordance with claim 28, in which the memory cell includes two bit storing positions that are located at crossing regions between the word line and the first bit line or the second bit line.

30. Integrated memory circuit in accordance with claim 27, in which the upper and the lower insulating region are formed of oxide, and the storing region is formed of nitride.

31. Integrated memory circuit in accordance with claim 27, in which the lower insulating layer, the storing layer and the upper insulating layer are also provided on the fill oxide layer of the bit line.

32. Integrated memo circuit in accordance with claim 27, in which a word line includes a lower polysilicon layer, a silicide layer above the polysilicon layer and an antireflective coating layer above the silicide layer.

33. Integrated memory cell in accordance with claim 27, in which the word line includes a layer of polysilicon, a layer of tungsten nitride, a layer of tungsten and, above the layer of tungsten, a hard mask.

34. Integrated memory circuit, comprising:
   a semiconductor substrate having a semiconductor substrate surface plain;
   an array of memory cells formed on the substrate, the array of memory cells including bit lines and word lines, the bit lines and word lines connecting the memory cells, the bit lines being formed of a material different from a material of the substrate and having a bit line top plane;
   trenches filled with insulating material are provided between adjacent word lines, the trenches extending deeper into the semiconductor substrate than a groove-shaped channel region of a memory cell;
   a controlling circuit formed on the substrate for controlling the array of memory cells, wherein the bit lines and the word lines extend into the controlling circuit; and
   wherein the bit lines are recessed with respect to the semiconductor substrate surface plane such that a difference between the bit line top plane and the semiconductor substrate surface plane is smaller than a predetermined value.

35. Integrated memory circuit in accordance with claim 34, wherein a memory cell includes a source region connected to a bit line, a drain region connected to a neighboring bit line, and the groove-shape channel region is formed between the source region and the drain region, the channel region including a lower insulating layer, a storing layer and an upper insulating layer.

36. Integrated memory circuit in accordance with claim 35,
   in which the source region of a memory cell is connected to a first bit line,
   in which the drain region of the memory cell is connected to a second neighboring bit line,
   in which a word line of the memory cell crosses the first bit line and the second bit line, the word line being positioned above the first bit line and the second bit line.

37. Integrated memory circuit in accordance with claim 36, in which the memory cell includes two bit storing positions that are located at crossing regions between the word line and the first bit, line or the second bit line.

38. Integrated memory circuit in accordance with claim 34, in which the upper and the lower insulating region are formed of oxide, and the storing region is formed of nitride.

39. Integrated memory circuit in accordance with claim 34, in which the bit line includes a lower polysilicon layer,
   a suicide layer on the lower polysilicon layer and a fill oxide layer above the silicide layer.

40. Integrated memo circuit in accordance with claim 34, in which the lower insulating layer, the storing layer and the upper insulating layer are also provided on the fill oxide layer of the bit line.

* * * * *

UNITED STATES PATENT AND TRADEMARK OFFICE
CERTIFICATE OF CORRECTION

PATENT NO. : 6,777,725 B2
APPLICATION NO. : 10/171643
DATED : August 17, 2004
INVENTOR(S) : Willer et al.

It is certified that error appears in the above-identified patent and that said Letters Patent is hereby corrected as shown below:

Column 13, Line 9 - Column 14, line 15 claims 14-26 should read as follows:

14. Integrated memory cell in accordance with claim 1, in which the predetermined value is defined by a lithography technique performed for patterning the word lines.

15. Method of forming an integrated memory circuit, the method comprising:

providing a semiconductor substrate;

forming bit line recesses in the substrate;

forming bit lines in the recesses, wherein two adjacent bit lines are connected to a source and a drain region of a memory cell in an array of memory cells;

forming gate regions of the memory cells; and forming word lines on the gate regions of the memory cells and gate structures of transistors in a control circuit for the array of memory cells, the word lines and the bit lines extending into the control circuit.

16. Method according to claim 15, in which the bit line recesses and the bit lines are designed such that the difference between a bit line top plane and a substrate surface plane is smaller than a predetermined value.

UNITED STATES PATENT AND TRADEMARK OFFICE
CERTIFICATE OF CORRECTION

| | |
|---|---|
| PATENT NO. | : 6,777,725 B2 |
| APPLICATION NO. | : 10/171643 |
| DATED | : August 17, 2004 |
| INVENTOR(S) | : Willer et al. |

It is certified that error appears in the above-identified patent and that said Letters Patent is hereby corrected as shown below:

(Column 13...Cont'd)

17. Method in accordance with claim 16, in which the predetermined value is 50 nanometers or smaller.

18. Method in accordance with claim 15, in which the step of providing a substrate includes providing an oxide layer on a substrate surface and a nitride layer above the oxide layer;

in which the step of forming bit line recesses includes the following substeps:

lithographically defining the bit line recesses;

selectively etching using the oxide layer as an etch stop;

selectively etching using nitride as an etch stop until a predetermined recess depth is obtained.

19. Method in accordance with claim 15, in which a step of implanting is performed before the step of forming bit lines.

20. Method in accordance with claim 15, wherein in the step of forming bit lines, metallized bit lines are produced.

UNITED STATES PATENT AND TRADEMARK OFFICE
CERTIFICATE OF CORRECTION

| | | |
|---|---|---|
| PATENT NO. | : 6,777,725 B2 | |
| APPLICATION NO. | : 10/171643 | |
| DATED | : August 17, 2004 | |
| INVENTOR(S) | : Willer et al. | |

It is certified that error appears in the above-identified patent and that said Letters Patent is hereby corrected as shown below:

(Column 13...Cont'd)

21. Method in accordance with claim 20, in which the step of forming bit lines includes the following substeps:

forming side wall spacers in the bit line recesses;

forming a layer of polysilicon in the bit line recesses;

forming a metal-silicon compound layer or a metal layer on the layer of polysilicon using a silicide method; and filling remaining gaps of the bit line recesses with oxide.

22. Method in accordance with claim 21, in which the metal of the silicon/metal compound is Co or Tungsten.

23. Method in accordance with claim 15, in which the step of forming gate regions includes the following substeps:

lithographically removing a nitride layer on the semiconductor substrate within the memory cell array:

selectively etching grooves into the semiconductor substrate using a top oxide layer of the bit lines as an etch stop; and forming an oxide-nitride layer in the grooves.

UNITED STATES PATENT AND TRADEMARK OFFICE
CERTIFICATE OF CORRECTION

| | |
|---|---|
| PATENT NO. | : 6,777,725 B2 |
| APPLICATION NO. | : 10/171643 |
| DATED | : August 17, 2004 |
| INVENTOR(S) | : Willer et al. |

It is certified that error appears in the above-identified patent and that said Letters Patent is hereby corrected as shown below:

(Column 13...Cont'd)

24. Method in accordance with claim 15, in which the step of forming word lines includes the following substeps:

filling remaining grooves in the gate regions with polysilicon;

proving a metal-silicon compound layer on the polysilicon layer and hard mask on the metal-silicon compound layer; and lithographically defining the word lines and etching the word lines using an oxide layer on the bit lines as an etch stop.

25. Method in accordance with claim 15, further comprising the following step:

forming the controlling circuit for controlling the array of memory cells as a CMOS circuit.

UNITED STATES PATENT AND TRADEMARK OFFICE
CERTIFICATE OF CORRECTION

| | |
|---|---|
| PATENT NO. | : 6,777,725 B2 |
| APPLICATION NO. | : 10/171643 |
| DATED | : August 17, 2004 |
| INVENTOR(S) | : Willer et al. |

It is certified that error appears in the above-identified patent and that said Letters Patent is hereby corrected as shown below:

(Column 13...Cont'd)

26. Method in accordance with claim 15, in which the step of providing a semiconductor substrate includes a step of forming a shallow trench insulation between adjacent word lines.

Signed and Sealed this

First Day of May, 2007

JON W. DUDAS
*Director of the United States Patent and Trademark Office*